(12) United States Patent
Chen et al.

(10) Patent No.: US 10,353,025 B2
(45) Date of Patent: Jul. 16, 2019

(54) MAGNETIC RESONANCE APPARATUS AND LOCAL RF COIL ASSEMBLY FOR USE THEREIN

(71) Applicant: Siemens Healthcare GmbH, Erlangen (DE)

(72) Inventors: Yong Chen, Shenzhen (CN); Chao Ming He, Shenzhen (CN); Yan Tu Huang, Shenzhen (CN); JianMin Wang, Shenzhen (CN)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 15/336,980

(22) Filed: Oct. 28, 2016

(65) Prior Publication Data

US 2017/0123034 A1 May 4, 2017

(30) Foreign Application Priority Data

Oct. 28, 2015 (CN) .......................... 2015 1 0711502

(51) Int. Cl.
*G01V 3/00* (2006.01)
*G01R 33/341* (2006.01)
*G01R 33/36* (2006.01)
*G01R 33/54* (2006.01)

(52) U.S. Cl.
CPC .......... *G01R 33/341* (2013.01); *G01R 33/36* (2013.01); *G01R 33/543* (2013.01)

(58) Field of Classification Search
CPC .......................... G01R 33/5659; G01R 33/283; G01R 33/341; G01R 33/36; G01R 33/3628; G01R 33/3642; G01R 33/3692; G01R 33/387; G01R 33/44; G01R 33/4808; G01R 33/543; G01R 33/56; G01R 33/5608; G01R 33/5612
USPC ........................................................ 324/309
See application file for complete search history.

(56) References Cited

U.S. PATENT DOCUMENTS

| 2010/0256477 | A1 | 10/2010 | Harvey et al. | |
| 2013/0193968 | A1* | 8/2013 | Biber | G01R 33/341 324/309 |
| 2014/0225613 | A1* | 8/2014 | Reykowski | G01R 33/3628 324/309 |
| 2018/0116518 | A1* | 5/2018 | Rinck | G06K 9/6202 |

* cited by examiner

*Primary Examiner* — Rodney E Fuller
(74) *Attorney, Agent, or Firm* — Schiff Hardin LLP (57) ABSTRACT

Disclosed in embodiments of the present invention are a local coil for an MRI system and a method of use, and an MRI system. The local coil comprises: a storage module, for storing a coil file, the coil file comprising configuration attribute information of the local coil; an interface module, for communication with the outside; a control module, for reading the coil file from the storage module and sending the coil file to the outside via the interface module, or receiving the coil file from the outside and storing the coil file in the storage module.

6 Claims, 4 Drawing Sheets

MAGNETIC RESONANCE APPARATUS AND LOCAL RF COIL ASSEMBLY FOR USE THEREIN

BACKGROUND OF THE INVENTION

Field of the Invention

The present invention concerns the technical field of medical information processing, in particular information concerning a local radio-frequency (RF) coil for a magnetic resonance imaging apparatus and a method of use of such a local RF coil therein, and a magnetic resonance imaging apparatus having such a local RF coil.

Description of the Prior Art

Magnetic resonance imaging (MRI) is an imaging modality involving biomagnetics and nuclear spin that has advanced rapidly with the development of computer technology, electronic circuit technology and superconductor technology. MRI uses a basic magnetic field and radio frequency (RF) pulses to induce oscillation of precessing hydrogen nuclei (i.e. H+) in human tissue, so as to generate RF signals that are processed by a computer to form an image. If an object is placed in a magnetic field and irradiated by suitable electromagnetic waves to produce resonance therein, and electromagnetic waves released thereby are then analyzed, it is possible to identify the positions and types of the atomic nuclei of which the object is composed. On this basis, a precise three-dimensional image of the interior of the object can be produced. For instance, a moving picture of contiguous slices can be obtained by performing an MRI scan of the human brain.

In an MRI system, a transmitting coil transmits RF pulses to bring about magnetic resonance. A local RF coil receives the RF magnetic resonance signal, and sends the magnetic resonance signal to a reception coil channel selector (RCCS) and a receiver. The magnetic resonance signal is digitized in the receiver. An image reconstruction computer uses a digital signal resulting from digitization to reconstruct an image.

In the prior art, configuration attribute information of the local coil is stored in an optical disk corresponding to the local coil. When the local coil is first installed on a patient table, it is necessary to insert the optical disk into an optical drive of the control computer of the MRI system. The control computer reads out the configuration attribute information of the local coil from the optical disk and configures the local coil accordingly. However, the procedure of acquiring configuration attribute information by the use of an optical disk is tedious. For instance, when it is necessary to install new local coils frequently, it is necessary to insert and withdraw optical disks frequently, and this leads to low working efficiency.

Furthermore, if the wrong optical disk is inserted by mistake, there is the possibility of the local coil being wrongly configured.

SUMMARY OF THE INVENTION

According to one aspect of the present invention, a local coil assembly for an MRI apparatus has a housing containing a local RF coil (coil conductor arrangement) designed to transmit and/or receive RF signals, an electronic storage module in the housing, in which a coil file is stored, the coil file containing configuration attribute information of the local RF coil, an interface module, for establishing a communication connection with an exterior of the housing, a control processor configured to read the coil file from the storage module and to send the coil file to the exterior via the interface module, or to receive the coil file from the exterior and to store the received coil file in the storage module.

Preferably, the coil file also contains quality verification information.

Preferably, the quality verification information includes test quality verification information and/or clinical quality verification information.

Preferably, the coil file also contains scan protocol information.

Preferably, the scan protocol information includes test scan protocol information and/or clinical scan protocol information.

According to another aspect of the embodiments of the present invention, a method of use of a local coil for an MRI system includes inserting a local coil assembly as described above into a patient table of the MRI system, acquiring the coil file from the local coil assembly, and reading the configuration attribute information from the coil file, and configuring the local RF coil on the basis of the configuration attribute information.

Preferably, the coil file also contains test scan protocol information, and the method of use also includes arranging a phantom on the patient table, operating a magnetic resonance data acquisition scanner to scan the phantom on the basis of the test scan protocol information so as to generate a phantom image, and testing the local RF coil on the basis of the phantom image.

Preferably, the coil file also includes clinical scan protocol information, and the method of use also includes arranging an examination subject on the patient table, and operating a magnetic resonance data acquisition scanner to scan the examination subject on the basis of the clinical scan protocol information so as to generate an examination subject image.

Preferably, the coil file also includes quality verification information, and the method also includes, when the local coil develops a fault, sending the coil file to a testing device, so that the testing device locates the fault on the basis of the quality verification information.

Another aspect of the invention is an MRI apparatus having a data acquisition scanner, a control computer, and a local coil assembly according to any of the embodiments described above.

As described above, the local coil assembly of the present invention has a housing containing an RF coil, a storage module, for storing a coil file, the coil file containing configuration attribute information of the local coil, an interface module, for communication with the exterior of the housing, a control computer configured to read the coil file from the storage module and to send the coil file to the exterior via the interface module, or to receive the coil file from the exterior and store the received coil file in the storage module. Unlike in the prior art where configuration attribute information of the local coil is stored in an optical disk, in the present invention configuration attribute information is stored in the local coil. When the local coil is connected into the MRI system, the configuration attribute information of the local coil can be acquired from the local coil, so as to configure the installation of the local coil simply and conveniently.

Moreover, test protocol information and clinical protocol information are also stored in the local coil, so as to perform a test scan process and a clinical scan process of the local coil.

Furthermore, quality verification information comprising test quality verification information and/or clinical quality verification information is also stored in the local coil. When the local coil develops a fault, the local coil sends quality verification information to a testing device, so that the testing device accurately locates the fault.

DESCRIPTION OF THE PREFERRED EMBODIMENTS

The present invention is explained in further detail below in conjunction with the accompanying drawings and embodiments, to clarify the technical solution and advantages thereof. It should be understood that the particular embodiments described herein are merely intended to explain the present invention by examples, not to define the scope of protection thereof.

The solution of the present invention is expounded below by describing a number of representative embodiments, in order to make the description concise and intuitive. The large number of details in the embodiments are merely intended to assist with understanding of the solution of the present invention. The technical solution of the present invention need not be limited to these details when implemented.

In the embodiments of the present invention, unlike in the prior art where configuration attribute information of the local coil is stored in an optical disk, the local coil stores its own configuration attribute information. When the local coil is connected into the MRI system, the local coil sends its own configuration attribute information to a control computer, so as to configure the installation of the local coil.

Figure 1:
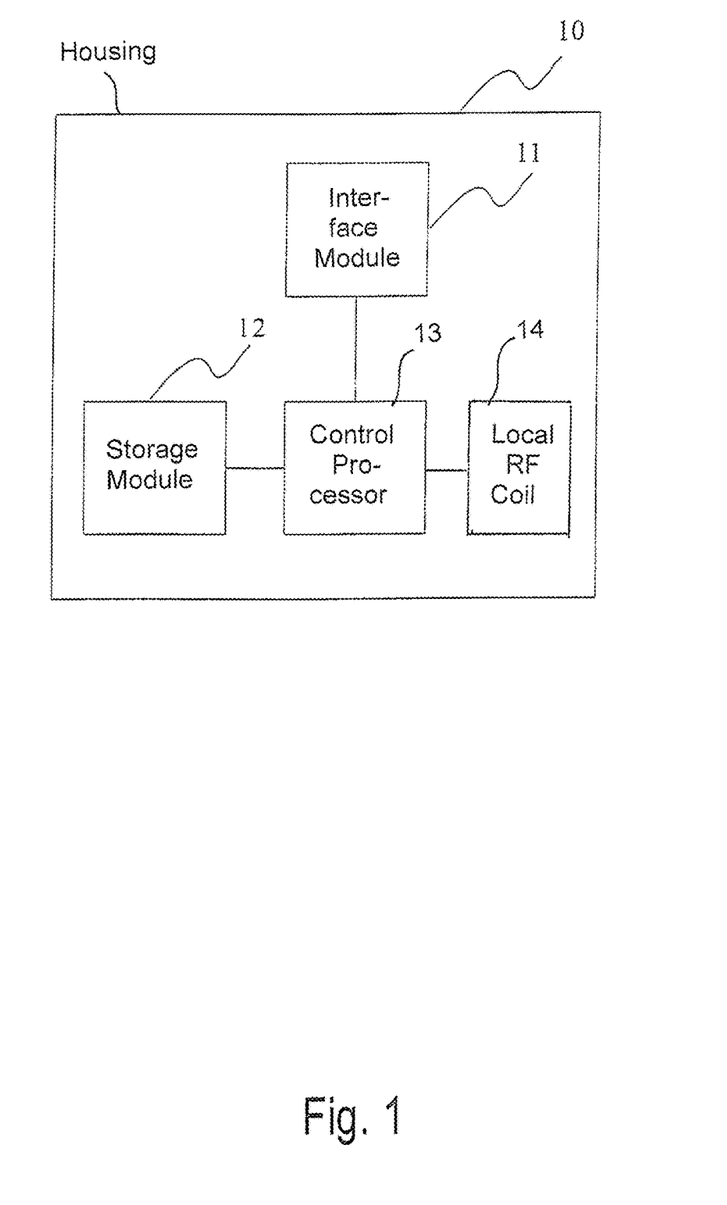
FIG. 1 is a block diagram of a local coil assembly of an MRI system according to an embodiment of the present invention.

FIG. 1 is a block diagram of a local coil assembly of an MRI system according to an embodiment of the present invention.

As FIG. 1 shows, the local coil assembly has a local RF coil 14 therein. As used herein, the term "local RF coil" is not limited in scope to a single coil or single loop antenna, but is intended to generally designate the overall conductor arrangement, which may include multiple transmitting coils and/or multiple receiving coils, that is designed to transmit and/or receive RF signals, particularly magnetic resonance signals in the reception case. Moreover, the local RF coil can be shaped in any structural configuration of the type known to those of ordinary skill in the field of magnetic resonance imaging, so as to be adapted to specific anatomy, such as the head, the knee, the wrist, etc.

The local coil assembly also has a storage module 11 in the housing 10. The storage module 11 stores a coil file, the coil file containing configuration attribute information of the local RF coil 14.

The local coil assembly also has a control processor 13 in the housing 10, for reading the coil file from the storage module 11 and sending the coil file to the exterior of the housing 10 via the interface module 12, or receiving the coil file from the exterior and storing the coil file in the storage module 11.

The configuration attribute information of the local coil assembly represents basic hardware parameters and default operating parameters of the local coil 14 thereof. Preferably, the configuration attribute information is at least one item of the following group: a label of the local coil 14, the number of RF signal receiving unit(s) formed by the local coil 14, a possible parallel acquisition (IPAT) factor in different directions of the local coil 14, a fast Fourier transform (FFT) correction factor of the local coil 14, an image measurement correction factor of the local coil 14, coil protection information of the local coil 14, coil type information of the local coil 14, position information of the local coil 14, patient safety related information of the local coil 14, a serial number of the local coil 14. Specifically, coil protection information of the local coil 14 may be peak voltage, average power, a B1 magnetic field limit value, etc.

During factory setting of the local coil assembly, the control processor 13 receives a coil file from the outside (i.e. a database for providing a coil file) via the interface module 12 and stores it in the storage module 11.

During installation of the local coil assembly (e.g. when the local coil assembly is first inserted into a coil interface on the patient table), the control processor 13 reads the coil file from the storage module 11 and sends the coil file to the exterior of the housing 10 to (e.g. a control computer of the MRI system) via the interface module 12.

During use of the local coil assembly (e.g. during a test scan or a clinical test scan), when the coil file is updated, the control processor 13 receives an updated coil file from the outside (e.g. from the control computer in the MRI system) via the interface module 12 and stores the updated coil file in the storage module 11.

The processes described above are explained in detail separately below.

During factory setting of the local coil assembly, the local coil assembly is connected to a database comprising coil files of various coil types. The control processor 13 receives a coil file corresponding to its own coil type from the database via the interface module 12, and stores the coil file in the storage module 11. The coil file stored in the storage module 11 includes configuration attribute information corresponding to its own coil type.

During installation of the local coil assembly, it is assumed that the external apparatus which receives the coil file is the control computer of the MRI system. Having received the coil file from the local coil assembly, the control computer reads outs configuration attribute information from the coil file, and configures the installation of the local coil 14 on the basis of the configuration attribute information. Preferably, the control computer can store, in its own storage medium, the coil file acquired from the local coil assembly. When the local coil assembly is inserted into the coil interface on the patient table again, the control computer can acquire the configuration attribute information of the local coil assembly by the coil file stored by itself, with no need to acquire the coil file from the local coil assembly again.

Once the local coil assembly has been installed, it is generally necessary to subject the MRI system to a test scan during a tune-up stage after start-up of the MRI system and during a quality assurance stage after the MRI system has been running for a certain period of time. The test scanning process needs to use corresponding test scan protocol information.

In one embodiment, during factory setting of the local coil assembly, scan protocol information is stored in the coil file. The scan protocol information includes test scan protocol information. Specifically, the test scan protocol information includes at least one of the following group: a test sequence name, a test scan region, a test echo time, a test repetition time, test gradient specifications, a test coil selection parameter, etc.

Having received the coil file from the local coil assembly, the control computer operates the scanner of the MRI apparatus to perform a test scan on the basis of the test scan protocol information in the coil file. Test quality verification information of the coil is generated during the test scan, e.g. a signal-to-noise ratio parameter, measurement uniformity parameter, etc. Preferably, the control computer stores test quality verification information from a predetermined period of time (e.g. the last week or month) in the coil file, to facilitate subsequent investigation and analysis of specific details of the test scan process. The control computer sends the updated coil file to the local coil assembly for storage therein.

When the test scan is complete, the MRI system can use the local coil 14 of the local coil assembly to perform a clinical scan of a patient, which is a scan designed to acquire an MR image of diagnostic quality. Similarly, the clinical scanning process needs to use corresponding clinical scan protocol information.

In one embodiment, the scan protocol information further includes clinical scan protocol information. Specifically, the clinical scan protocol information comprises at least one of the following group: a clinical sequence name, a clinical scan region, a clinical echo time, a clinical repetition time, clinical gradient specifications, or a clinical coil selection parameter, etc.

Having received the coil file from the local coil assembly, the control computer performs a clinical scan on the basis of the clinical scan protocol information in the coil file. Corresponding clinical quality verification information is generated during clinical scanning. The clinical quality verification information includes: a signal-to-noise ratio parameter, a measurement uniformity parameter, a clinical scan image of a patient, etc. Preferably, the control computer of the MRI apparatus can store clinical quality verification information from a predetermined period of time (e.g. the last week or month) in the coil file, to facilitate subsequent investigation and analysis of specific details of the clinical scan process. The control computer sends the updated coil file to the local coil assembly for storage therein in the storage module.

Specifically, the storage module 11 may be implemented as a storage medium such as read only memory (ROM), programmable read only memory (PROM), erasable programmable memory (EPROM), electrically erasable programmable memory (EEPROM), Flash ROM, etc.

Moreover, the local coil 14 may specifically be implemented as a head coil, neck coil, head/neck coil, body coil, limb coil, shoulder coil, spine coil, large flexible coil, small flexible coil or ankle coil, etc.

Preferably, the interface module 12 sends the coil file to the exterior of the housing 10 or receive the coil file in a wired or wireless manner.

When the interface module 12 sends the coil file to the exterior or receives the coil file in a wired manner, the interface module 12 may be connected in a wired manner to the outside via a single stranded wire or twisted pair, etc. Moreover, the interface module 12 may be connected to the exterior via a bus such as a serial peripheral interface (SPI) or inter-integrated circuit (I2C).

When the interface module 12 sends the coil file to the outside or receives the coil file in a wireless manner, the interface module 12 may specifically be implemented as a Wi-Fi functional module, bluetooth communication module, infrared communication module, 2G communication module, 3G communication module or 4G communication module, etc.

Typical examples of the local coil 14, storage module 11 and interface module 12 are described in detail above. Those skilled in the art will realize that such a description is merely demonstrative, and not intended to define the scope of protection of the embodiments of the present invention.

The present invention also encompasses a method of use of such a local coil assembly of an MRI system.

Figure 2:
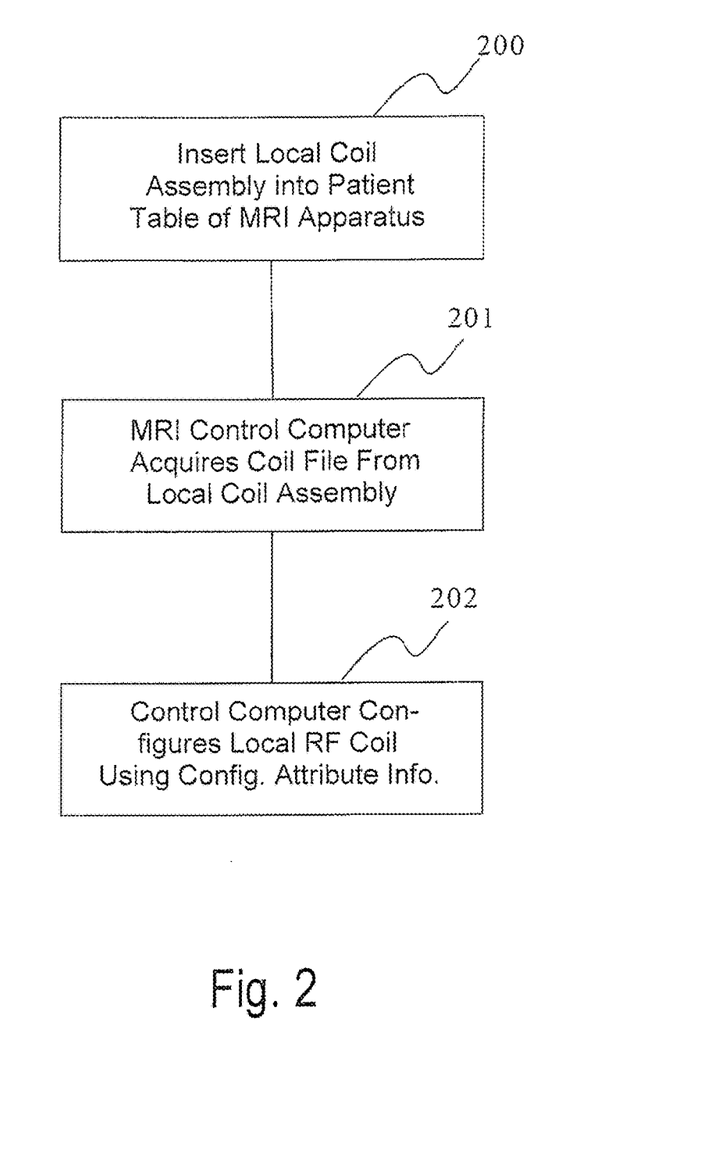
FIG. 2 is a flowchart of a method of use of a local coil assembly of an MRI system according to an embodiment of the present invention.

FIG. 2 is a flowchart of a method of use of a local coil assembly of an MRI system according to an embodiment of the present invention.

As FIG. 2 shows, the method includes the following steps.

Step 200: a local coil assembly as described in FIG. 1 is inserted into a patient table of the MRI system.

Specifically, the configuration attribute information stored in the coil file of the local coil assembly includes at least one of the following group: a label of the local coil 14, the number of RF signal receiving unit(s) formed by the local coil 14, a possible IPAT factor in different directions of the local coil 14, an FFT correction factor of the local coil 14, an image measurement correction factor of the local coil 14, coil protection information of the local coil 14, coil type information of the local coil 14, position information of the local coil 14, patient safety related information of the local coil 14, a serial number of the local coil 14. The coil protection information of the local coil 14 may be peak voltage, average power and B1 magnetic field limit value, etc.

Step 201: the control computer of the MRI apparatus acquires the coil file from the local coil, and reads configuration attribute information from the coil file.

Step 202: the control computer configures the local coil on the basis of the configuration attribute information.

Once configuration of the local coil is complete, various types of phantom may be used to subject the local coil to a test scan. The phantom contains a liquid, and may have various shapes such as spherical or pillow-shaped.

In one embodiment, the coil file also contains test scan protocol information. When the test scan begins, a phantom stored in a cabinet is moved onto the patient table of the MRI apparatus; the MRI system scans the phantom on the basis of test protocol information so as to generate a phantom image, and tests the local coil on the basis of the phantom image. When the phantom image complies with a preset standard, the local coil is identified as operating normally; when the phantom image does not comply with a preset standard, the local coil is identified as having developed a fault. A clinical scan of a patient may only be performed if the local coil is identified as operating normally.

The control computer also stores coil test quality verification information from a predetermined period of time (e.g. the last week or month) in the coil file, and sends the updated coil file to the local coil assembly for storage therein.

When the test scan is complete, the MRI system can use the local coil 14 to perform a clinical scan of a patient.

In one embodiment, clinical scan protocol information is also stored in the coil file. Specifically, the clinical scan protocol information includes at least one of the following group: a clinical sequence name, a clinical scan region, a clinical echo time, a clinical repetition time, clinical gradient specifications, a clinical coil selection parameter, etc.

A further embodiment of the method arranging an examination subject on the patient table, and operating a magnetic resonance data acquisition scanner to scan the examination subject on the basis of the clinical scan protocol information so as to generate an image of the examination subject. The control computer also stores clinical quality verification information from a predetermined period of time (e.g. the last week or month) in the coil file, and sends the updated coil file to the local coil 10 for storage therein.

When the local coil assembly develops a fault, the local coil assembly is removed and connected to a testing device supplied by the manufacturer. The local coil assembly sends the coil file to the testing device, so that the testing device locates the fault on the basis of quality verification information including test quality verification information and/or clinical quality verification information.

Based on the analysis above, the present invention also proposes an MRI system.

Figure 3:
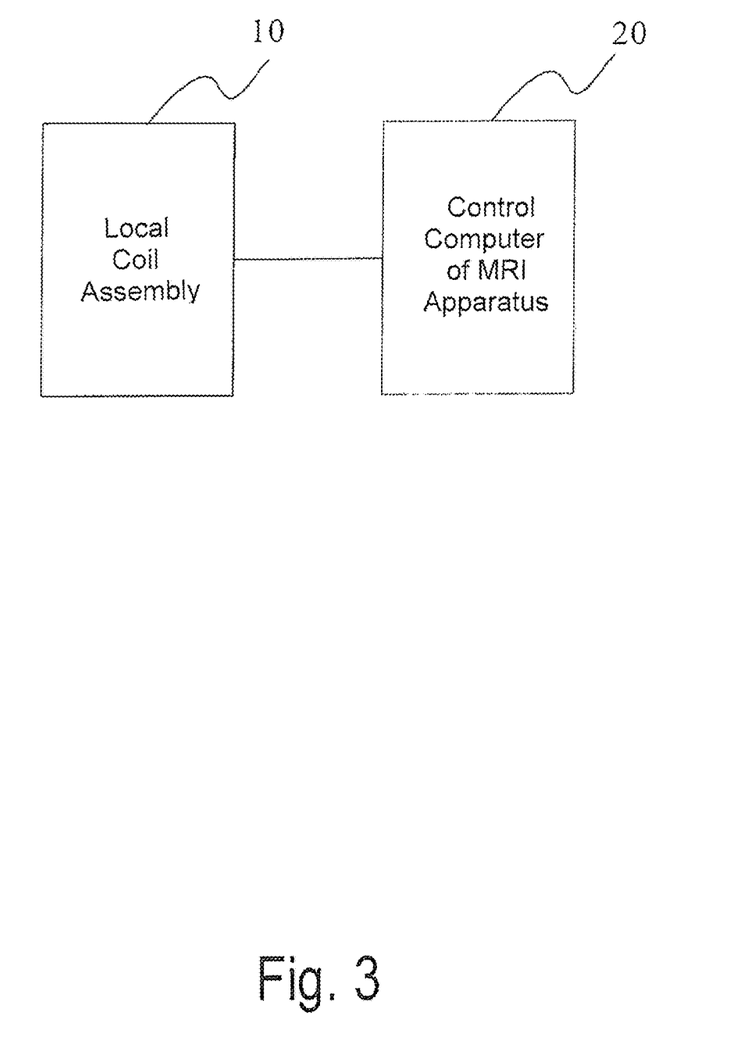
FIG. 3 is a block diagram of an MRI system according to an embodiment of the present invention.

FIG. 3 is a block diagram of an MRI system according to an embodiment of the present invention.

As FIG. 3 shows, the MRI system has the local coil assembly as shown in FIG. 1, and a control computer 20, for acquiring a coil file from the local coil assembly, reading configuration attribute information from the coil file, and configuring the local coil 14 on the basis of the configuration attribute information.

In one embodiment, the coil file also contains quality verification information. Preferably, the quality verification information includes test quality verification information and/or clinical quality verification information.

In one embodiment, the coil file also contains scan protocol information.

Preferably, the scan protocol information includes test scan protocol information and/or clinical scan protocol information.

Figure 4:
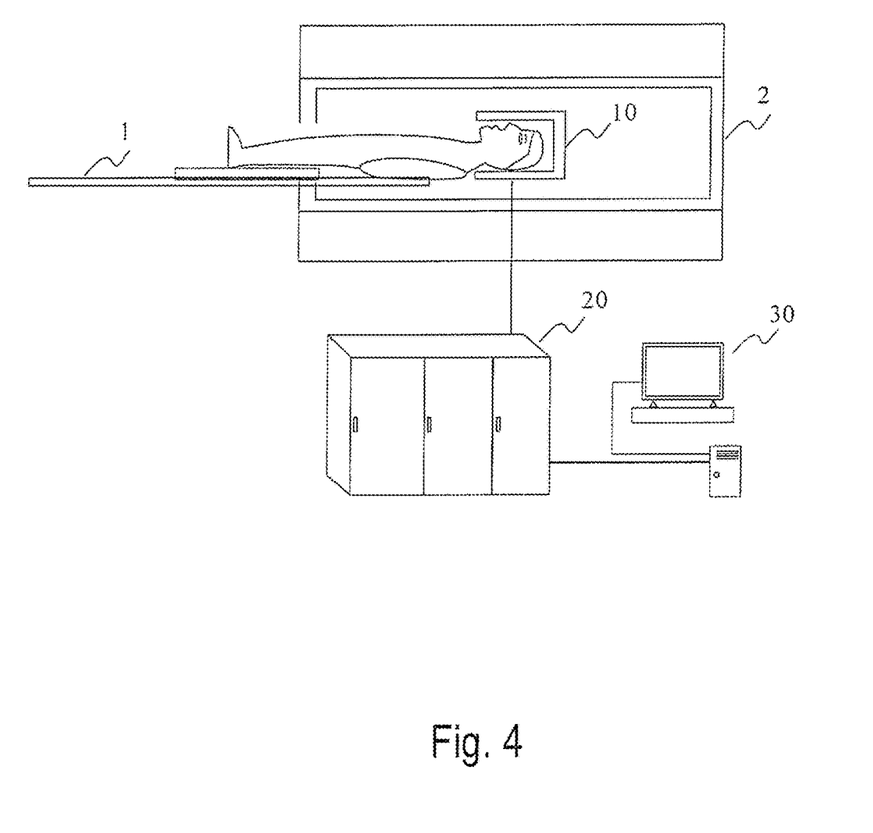
FIG. 4 is a schematic illustration of an MRI system according to an embodiment of the present invention.

FIG. 4 is a schematic illustration of an MRI system according to an embodiment of the present invention.

The MRI system has a patient table 1 which moveably enters/exits a scanner 2, wherein a basic magnetic field and gradient magnetic fields are generated. The patient table 1 may be located on top of a support which serves a supporting function, and the support is generally fixed.

A coil assembly 10 with the coil 14 thereof in the form of a head coil is arranged on the patient table 1, a coil file being stored in the coil assembly, the coil file containing configuration attribute information of the coil assembly, test scan protocol information and clinical scan protocol information. A control computer 20 has an RCCS and a receiver integrated therein. An image reconstruction computer 30 is connected to the control computer 20.

During operation of the MRI system, one or more RF signal receiving units in the coil assembly receives a magnetic resonance signal, and sends the magnetic resonance signal to the control computer 20. The magnetic resonance signal is digitized in the control computer 20. The image reconstruction computer 30 uses a digital signal resulting from digitization to reconstruct an image.

When the coil assembly is first installed on the patient table 1, the control computer 20 reads the coil file from the coil assembly, and configures the installation of the coil assembly on the basis of the configuration attribute information in the coil file.

In a quality assurance stage and a tune-up stage after start-up of the MRI system, the control computer 20 also reads test scan protocol information from the coil file, and tests the coil assembly on the basis of the test scan protocol information. The specific testing process includes arranging a phantom in a predetermined position on the patient table 1, the control computer 20 reading test scan protocol information from the coil file, and scanning the phantom on the basis of the test scan protocol information. When a phantom image produced by scanning complies with a preset standard, the control computer 20 identifies the coil assembly as operating normally; when the phantom image produced by scanning does not comply with the preset standard, the control computer 20 identifies the coil assembly as having developed a fault. The control computer 20 may store, in the coil file of the coil assembly, test quality verification information generated during the test scan, so as to facilitate subsequent investigation and analysis of specific details of the test scan process. For example, test quality verification information from the last month may be stored in the coil file of the coil assembly.

When the control computer 20 identifies the coil assembly as operating normally, the MRI system may use the coil assembly to perform a clinical test of a patient. Specifically, the patient is arranged on the patient table 1, and the control computer 20 proceeds to read clinical scan protocol information stored in the coil assembly, and scans the patient on the basis of the clinical scan protocol information. Moreover, the control computer 20 records, in the coil file of the coil assembly, clinical quality verification information generated during the clinical test, so as to facilitate subsequent investigation and analysis of specific details of the clinical test process. For example, clinical quality verification information from the last month may be stored in the coil file of the coil assembly.

When it is discovered during testing or operation that the coil assembly has developed a fault, the coil assembly is removed and sent back to the factory to be overhauled. The coil assembly is connected to a testing device at the manufacturer. The coil assembly sends the coil file containing test quality verification information and/or clinical quality verification information to the testing device; the testing device can locate the fault on the basis of the test quality verification information and/or clinical quality verification information.

The present invention is explained in detail taking the case of a head coil as an example in FIG. 4. Those skilled in the art will realize that the present invention can also be applied to a local coil such as a neck coil, head/neck coil, body coil, limb coil, shoulder coil, spine coil, large flexible coil, small flexible coil or ankle coil.

The local coil testing method for an MRI system may be in the form of a plug-in program installed in a personal computer, mobile terminal or medical equipment, etc., abiding by an application programming interface with given specifications, or may be packaged as an application program for a user to download and use. The local coil testing method for an MRI system may be stored on various storage media by instruction or instruction set storage. These storage media include but are not limited to: floppy disk, optical disk, DVD, hard disk, flash memory, etc. Furthermore, the local coil testing method for an MRI system proposed in an embodiment of the present invention may also be applied in storage media based on flash memory (Nand flash), such as USB stick, CF card, SD card, SDHC card, MMC card, SM card, memory stick, xD card, etc.

In summary, the inventive local coil assembly has a housing that contains a local RF coil and that also contains a storage module, for storing a coil file, the coil file containing configuration attribute information of the local coil. An interface module is also contained in the housing, for communication with the exterior of the housing. A control computer is contained in the housing and is configured to read the coil file from the storage module and to send the coil file to the exterior of the housing via the interface module, or to receive the coil file from the exterior and to store the coil file in the storage module. Unlike in the prior art where configuration attribute information of the local coil is stored in an optical disk, in the present invention, configuration attribute information is stored in the local coil assembly. When the local coil assembly is connected into the MRI system, the control computer of the MRI apparatus can acquire the configuration attribute information of the local coil from the local coil assembly, so as to configure the installation of the local coil simply and conveniently.

Moreover, test scan protocol information and/or clinical scan protocol information is/are also stored in the local coil assembly, so as to perform a test scan procedure and a clinical scan procedure using the local coil.

Furthermore, coil test quality verification information and/or clinical quality verification information is/are also stored in the local coil assembly. When the local coil assembly develops a fault, the local coil sends test quality verification information and/or clinical quality verification information to a testing device, so that the testing device accurately locates the fault.

The invention claimed is:

1. A local coil assembly for a magnetic resonance (MR) imaging apparatus, said local coil assembly comprising:
 a housing;
 a local radio-frequency (RF) coil in said housing, said local RF coil having a coil design for at least one of transmitting RF signals and receiving RF signals;
 a storage module in said housing configured to store therein a coil file for said local RF coil, said coil file comprising configuration attribute information for said local RF coil that defines or designates said at least one of transmitting said RF signals and receiving said RF signals by said local RF coil, said coil file also comprising at least one sequence protocol to be executed by the MR imaging apparatus with said local RF coil installed herein, and said coil file also comprising quality verification information that describes a performance quality of said RF coil that occurred during execution of said sequence protocol;
 an interface module connected in said housing to said storage module, said interface module being configured to communicate with an exterior of said housing; and
 a control processor in said housing connected to said interface module, said control processor being configured to read said control file from said storage module and send said coil file to said exterior of said housing via said interface module, or to receive said coil file from said exterior of said housing and to store the receive coil file in said storage module.

2. A local coil assembly as claimed in claim 1 wherein said at least one sequence protocol is a sequence protocol selected from the group consisting of a test protocol to test said local RF coil, and a scan sequence protocol to acquire MR data from a subject in a clinical scan.

3. A method for using a local radio-frequency (RF) coil in a magnetic resonance (MR) imaging apparatus, said method comprising:
 providing a local coil assembly having a housing having a local RF coil therein, said local RF coil having a coil design for at least one of transmitting RF signals and receiving RF signals;
 providing a storage module in said housing configured to store therein a coil file for said local RF coil, said coil file comprising configuration attribute information for said local RF coil that defines or designates said at least one of transmitting said RF signals and receiving said RF signals by said local RF coil, said coil file also comprising at least one sequence protocol to be executed by the MR imaging apparatus with said local RF coil installed herein, and said coil file also comprising quality verification information that describes a performance quality of said RF coil that occurred during execution of said sequence protocol;
 providing an interface module connected in said housing to said storage module, said interface module being configured to communicate with an exterior of said housing;
 providing a control processor in said housing connected to said interface module, said control processor being configured to read said control file from said storage module and send said coil file to said exterior of said housing via said interface module, or to receive said coil file from said exterior of said housing and to store the receive coil file in said storage module;
 installing the local RF coil in an MR apparatus inserting said local coil assembly in a patient table of the MR apparatus and thereby placing said interface module of said local coil assembly in communication with a control computer of the magnetic resonance imaging apparatus;
 with said control computer, acquiring the coil file from the storage module of the local coil assembly, via the interface module and the control processor of the local coil assembly, and reading the configuration attribute information, and the sequence protocol from the coil file;
 from the control computer of the magnetic resonance imaging apparatus, configuring the local RF coil based on said configuration attribute information, via said interface module and said control processor of said local coil assembly;
 with said control computer, operating the magnetic resonance apparatus so as to execute said sequence protocol and thereby obtain said quality verification information; and
 from said control computer, sending said quality verification information to said control processor of said local coil assembly, via said interface module of said local coil assembly and, from said control processor, entering said quality verification information into said coil file in said storage module.

4. A method as claimed in claim 3 wherein said at least one sequence protocol is a sequence protocol selected from the group consisting of a test protocol to test said local RF coil, and a scan sequence protocol to acquire MR data from a subject in a clinical scan.

5. A magnetic resonance (MR) imaging apparatus comprising:
 an MR data acquisition scanner comprising a patient table;
 a local coil assembly comprising a housing, a local radio-frequency (RF) coil comprising a coil design for at least one of transmitting RF signals and receiving RF signals, a storage module configured to store therein a coil file for said local RF coil, said coil file comprising configuration attribute information for said local RF coil that defines or designates said at least one of transmitting said RF signals and receiving said RF signals by said local RF coil, said coil file also comprising at least one sequence protocol to be executed by the MR imaging apparatus with said local RF coil installed herein, and said coil file also comprising quality verification information that describes a performance quality of said RF coil that occurred during execution of said sequence protocol said local coil assembly further comprising an interface module connected in said housing to said storage module, said interface module being configured to communicate with an exterior of said housing;

said local coil assembly further comprising a control processor in said housing connected to said interface module, said control processor being configured to read said control file from said storage module and send said coil file to said exterior of said housing via said interface module, or to receive said coil file from said exterior of said housing and to store the receive coil file in said storage module;

said interface module of said local coil assembly being adapted to communicate with an interface at said patient table;

a control computer in communication with said interface at said patient table to read said coil file from said local coil assembly via said control processor and said interface module of said local coil assembly;

said control computer being configured to configure said local RF coil dependent on said configuration attribute information in said coil file; and said control computer being configured to operate the magnetic resonance apparatus so as to execute said sequence protocol and thereby obtain said quality verification information; and said control computer being configured to send said quality verification information to said control processor of said local coil assembly, via said interface module of said local coil assembly, and said control processor being configured to enter said quality verification information into said coil file in said storage module.

6. An MR imaging apparatus as claimed in claim 5 wherein said at least one sequence protocol is a sequence protocol selected from the group consisting of a test protocol to test said local RF coil, and a scan sequence protocol to acquire MR data from a subject in a clinical scan.

* * * * *